(12) United States Patent
Zhu et al.

(10) Patent No.: US 8,067,886 B2
(45) Date of Patent: Nov. 29, 2011

(54) COMPOSITE OPTICAL DESTRUCTIVE ELECTRODE FOR HIGH CONTRAST ELECTROLUMINESCENT DEVICES

(75) Inventors: Furong Zhu, Singapore (SG); Kian Soo Ong, Singapore (SG); Xiaotao Hao, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 955 days.

(21) Appl. No.: 11/597,477

(22) PCT Filed: May 25, 2004

(86) PCT No.: PCT/SG2004/000146
§ 371 (c)(1),
(2), (4) Date: Oct. 19, 2007

(87) PCT Pub. No.: WO2005/117501
PCT Pub. Date: Dec. 8, 2005

(65) Prior Publication Data
US 2008/0122352 A1    May 29, 2008

(51) Int. Cl.
*H05B 33/00* (2006.01)
(52) U.S. Cl. .................. 313/504; 313/112; 313/506
(58) Field of Classification Search ............... None
See application file for complete search history.

(56) References Cited

U.S. PATENT DOCUMENTS

| | | | |
|---|---|---|---|
| 5,049,780 A | 9/1991 | Dobrowolski et al. | |
| 5,504,389 A | 4/1996 | Dickey | |
| 6,339,291 B1 * | 1/2002 | Codama | 313/506 |
| 6,411,019 B1 | 6/2002 | Hofstra et al. | |
| 6,429,451 B1 | 8/2002 | Hung et al. | |
| 6,545,409 B2 | 4/2003 | Kahen | |
| 6,586,876 B2 | 7/2003 | Tsai et al. | |
| 6,608,333 B1 | 8/2003 | Lee et al. | |
| 6,784,602 B2 * | 8/2004 | Hofstra et al. | 313/112 |

(Continued)

FOREIGN PATENT DOCUMENTS

| | | |
|---|---|---|
| JP | 11-8075 | 1/1999 |
| JP | 11-48387 | 2/1999 |
| WO | WO-03/005776 | 1/2003 |

OTHER PUBLICATIONS

Chinese Office Action dated Oct. 21, 2009 directed at application No. 2007-514995; 4 pages.

(Continued)

*Primary Examiner* — Ashok Patel
(74) *Attorney, Agent, or Firm* — Morrison & Foerster LLP

(57) ABSTRACT

The present invention in one embodiment introduces a composite optical destructive layer (35) into the electroluminescent device which reduces the reflection of ambient light from the device. The composite optical destructive layer (35) is advantageously made of materials already found in the manufacturing process of the electroluminescent device (70) and also by manufacturing processes inherent in the manufacture of the device. More particularly, the composite optical destructive layer (35) is made from a variant of a parent material used to form one of the electrodes (12) of the electroluminescent device. The variant material differs from the parent material in that the variant material is oxygen deficient. This oxygen deficiency in the variant material causes the variant material to have a change in refractive index from that of the parent material. The composite optical destructive layer (35) that is made from the variant material is then able to absorb incident ambient light as well as reflected ambient light from the electroluminescent device (70).

7 Claims, 4 Drawing Sheets

U.S. PATENT DOCUMENTS

| | | | |
|---|---|---|---|
| 6,905,788 B2 * | 6/2005 | Tyan et al. | 428/690 |
| 7,116,045 B2 * | 10/2006 | Karasawa et al. | 313/501 |
| 2003/0038593 A1 | 2/2003 | Aziz et al. | |

OTHER PUBLICATIONS

Grandin et al. (2003). "Light-Absorption Phenomena in Novel Low-Reflectance Cathodes for Organic Light-Emitting Devices Utilizing Metal-Organic Mixtures," *Advanced Materials* 15(23):2021-2024.

Krasnov, Alexey N. (2002). "ELDs Rise on Organic Wings," *Information Display* 3/02:18-22.

Luxell the Black Layer Company, "Black Layer™ OLED Contrast Enhancement Technology," Technology Licensing 2003.

Wong et al. (2004). "Non-reflective black cathode in organic light-emitting diode," *Thin Solid Films* 446:143-146.

Xie and Hung. (2004). "High-contrast organic light-emitting diodes," *Applied Physics Letters* 84(7):1207-1209.

* cited by examiner

US 8,067,886 B2

COMPOSITE OPTICAL DESTRUCTIVE ELECTRODE FOR HIGH CONTRAST ELECTROLUMINESCENT DEVICES

FIELD OF THE INVENTION

The present invention generally relates to electroluminescent devices such as organic/polymeric light emitting devices (OLED/PLEDs). In particular, the invention relates to reducing reflectivity and enhancing the contrast in OLED/PLEDs by having a composite optical destructive layer.

BACKGROUND OF THE INVENTION

OLED/PLEDs have in recent years been actively used in Flat Panel Displays (FPDs) technology. Both organic and polymeric light emitting devices will hereinafter be referred to as OLEDs.

An OLED is made up of at least two electrodes (a cathode and an anode), with an electroluminescent stack sandwiched between the two electrodes. The electroluminescent stack may further comprise of several layers, examples of which are: light emitting layer, hole transport layer and electron transport layer. The working principles of OLEDs are well known in the art and need not be further discussed here.

The electrodes of OLEDs are often made of metal or are formed on rigid or flexible substrates which are both highly reflective. When using such OLEDs in FPDs, this becomes a genuine concern. The metal electrodes of the OLEDs making up the FPD acts collectively like a mirror and disadvantageously reflects ambient light away from the FPD. This causes the FPD to exhibit low visual contrast and poor legibility. Similarly, when electrodes are formed on highly reflective glass-like substrates reflection of ambient light off these glass-like substrates also causes low visual contrast and poor legibility.

Present attempts at reducing this reflection of ambient light in OLEDs are disadvantageously expensive.

Polarizer films have been used to enhance liquid crystal displays to good effect and can be similarly applied for FPDs. However, the adding of the polarizer film constitutes an additional bonding step to the production of the FPD. This aside, polarizer films are subjective to humidity and temperature environments, as such, the operating condition of the FPD is constrained to a limited range of humidity and temperature of the polarizer films. This also results disadvantageously in the inclusion of a material not inherently part of the manufacturing process of the FPD. This eventually results in higher costs.

Aziz et al in US Patent Application Publication No. 2003/0038593A1 teaches an electrically conductive light absorbing layer at the cathode of a bottom emitting OLED. This electrically conductive light absorbing layer serves to absorb reflected ambient light from the cathode and improves the overall contrast and legibility. This light absorbing layer is typically made of a mixture of organic and metal and is placed between the cathode and the organic layer.

There are also other methods using additional light absorbing layers of a variety of different materials. However, they essentially address the reducing of reflected ambient light by incorporating a low reflectivity composite cathode that requires an additional step for device optimization.

It can thus be seen that there exists a need for a simple and effective way for reducing ambient light reflection of OLEDs.

SUMMARY OF THE INVENTION

The present invention seeks to provide a composite optical destructive layer and composite optical destructive electrode for reducing reflectivity and enhancing visual contrast in OLEDs.

Accordingly, in one aspect, the present invention provides, an electroluminescent device comprising: a first electrode; a second electrode; an electroluminescent stack formed between the first electrode and the second electrode; the electroluminescent stack comprising at least one light emitting layer; and a composite optical destructive layer formed on at least one of the first electrode and the second electrode for reducing reflection of ambient light; wherein the composite optical destructive layer is formed from at least a variant of a parent material forming at least one of the first electrode and the second electrode.

Accordingly, in another aspect, the present invention provides, an electroluminescent device comprising: a first composite optical destructive electrode capable of reducing reflection of ambient light; a second electrode; and an electroluminescent stack formed between the first composite optical destructive electrode and the second electrode; the electroluminescent stack comprising at least one light emitting layer; wherein the first composite optical destructive electrode exhibits a gradient of varying degrees of refractive index.

In yet another aspect, the present invention provides, a bottom emitting organic light emitting device comprising: a substantially transparent first electrode; a second electrode; an electroluminescent stack formed between the substantially transparent first electrode and the second electrode; the electroluminescent stack comprising at least one light emitting layer; a composite optical destructive layer for reducing reflection of ambient light formed on the substantially transparent first electrode; wherein the composite optical destructive layer is formed from at least a variant of a parent material forming the substantially transparent first electrode.

In yet a further aspect, the present invention provides, a top emitting organic light emitting device comprising: a first electrode; a substantially transparent second electrode; an electroluminescent stack formed between the first electrode and the second substantially transparent electrode; the electroluminescent stack comprising at least one light emitting layer; a composite optical destructive layer for reducing reflection of ambient light formed on the substantially transparent second electrode; wherein the composite optical destructive layer is formed from at least a variant of a parent material forming the substantially transparent second electrode.

BRIEF DESCRIPTION OF THE DRAWINGS

A preferred embodiment of the present invention will now be more fully described, with reference to the drawings of which.

DETAILED DESCRIPTION OF THE DRAWINGS

A light absorbing electrode for OLEDs with a preferred embodiment and an alternate embodiment is described. In the following description, details are provided to describe the preferred and the alternate embodiment. It shall be apparent to one skilled in the art, however that the invention may be practiced without such details. Some of the details may not be described at length so as not to obscure the invention.

Figure 1A:
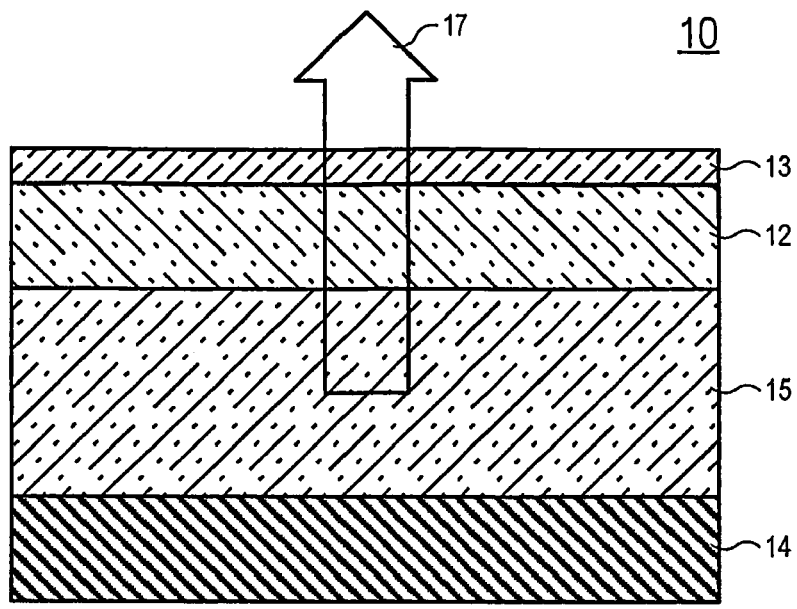
FIG. 1 illustrates prior art a) bottom emitting OLED and b) top emitting OLED.

OLEDs can be further classified into bottom emitting and top emitting OLEDs. Referring to FIG. 1a, a typical bottom emitting OLED 10 comprises a substantially transparent first electrode 12 formed on a rigid or flexible transparent substrate 13 and an electroluminescent stack 15 formed between the substantially transparent first electrode 12 and a second electrode 14. The electroluminescent stack 15 will further comprise at least a light emitting layer for producing illumination 17 viewable through the substantially transparent first electrode 12 and transparent substrate 13.

Figure 1B:
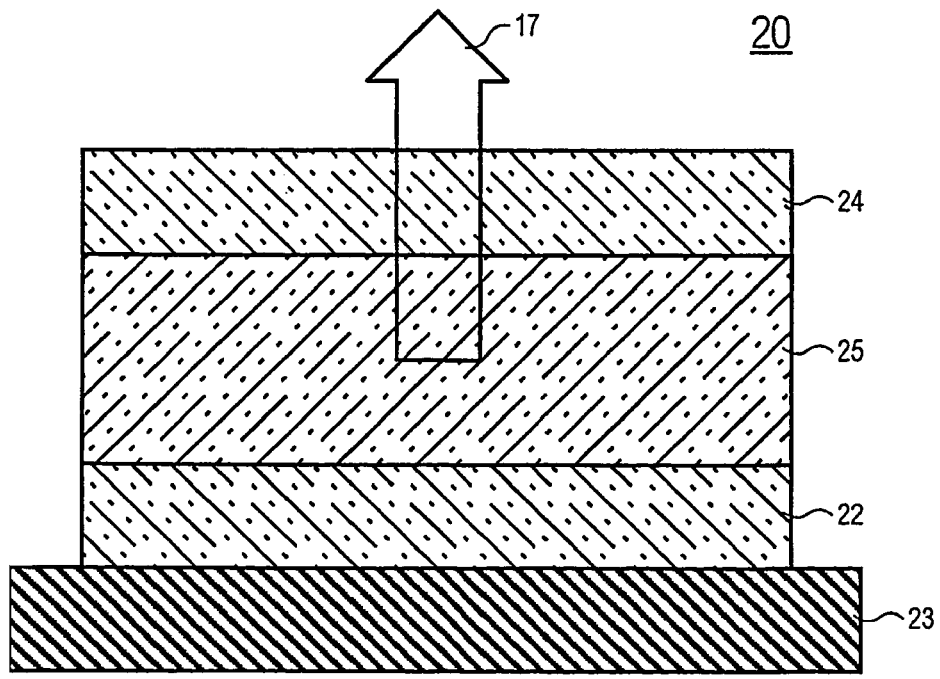

Referring to FIG. 1b, a top emitting OLED 20 comprises a first electrode 22 formed on a substrate 23 and a substantially transparent second electrode 24. An electroluminescent stack 25 is formed between the first electrode 22 and the substantially transparent second electrode 24. Similarly, the electroluminescent stack 25 also comprises at least one light emitting layer for producing illumination 17 viewable through the substantially transparent cathode 24.

The second electrode 14 of the bottom emitting OLED 10 and the first electrode 22 of the top emitting OLED 20 are often made of metal or have highly reflective surfaces. This metal electrodes or highly reflective surfaces reflect ambient light which causes low contrast and poor legibility in FPDs made from these OLEDs.

The present invention in one embodiment introduces a composite optical destructive layer into the OLED which reduces the reflection of ambient light from the OLED. The composite optical destructive layer is advantageously made of materials already found in the manufacturing process of the OLED and also by manufacturing processes inherent in the manufacture of the OLED. More particularly, the composite optical destructive layer is made from a variant of a parent material used to form one of the electrodes of an OLED. The variant material differs from the parent material in that the variant material is oxygen deficient.

The oxygen deficiency in the variant material causes the variant material to have a change in refractive index from that of the parent material. The composite optical destructive layer that is made from the variant material is then able to absorb incident ambient light as well as reflected ambient light from the electroluminescent device.

In another embodiment, the composite optical destructive layer may further be incorporated into one of the electrodes of an OLED resulting in a composite optical destructive electrode. The composite optical destructive electrode comprises a gradient of varying degrees of oxygen deficiency in the material that is used to form the electrode. The composite optical destructive electrode further exhibits a gradient of varying degrees of refractive index caused by the varying oxygen deficiency. The composite optical destructive electrode is thus also able to absorb incident ambient light as well as reflected ambient light from the electroluminescent device.

Figure 2A:
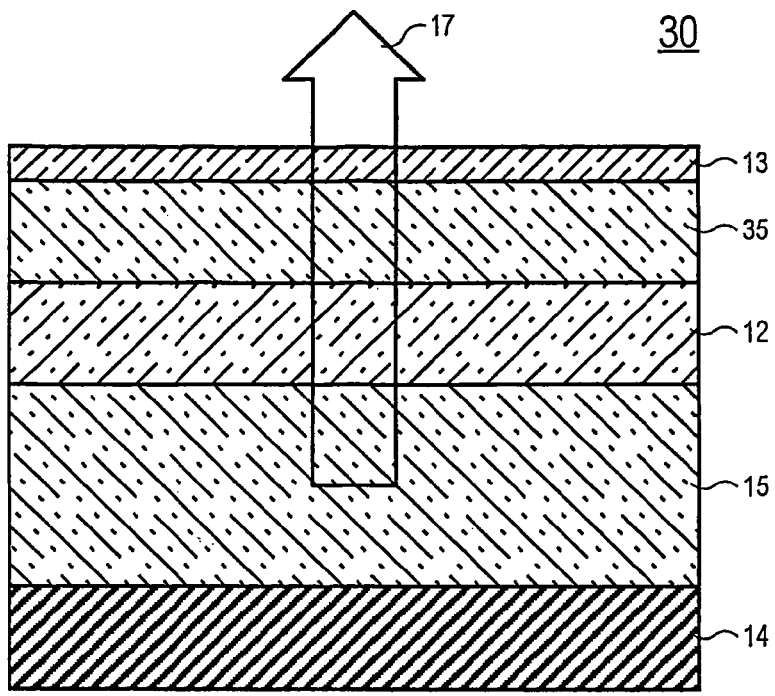
FIG. 2 illustrates a) bottom emitting OLED and b) top emitting OLED in accordance with the present invention.

Referring to FIG. 2a, a bottom emitting OLED 30 in accordance with the present invention has the composite optical destructive layer 35 formed between the transparent substrate 13 and the substantially transparent first electrode 12. The composite optical destructive layer 35 is made from a highly oxygen deficient variant of the substantially transparent first electrode 12.

The substantially transparent anode 12 of the bottom emitting OLED 30 is typically made of a transparent conductive oxide (TCO). The composite optical destructive layer 35 of the bottom emitting OLED 30 is advantageously made of substantially the same TCO, but exhibiting high oxygen deficiency. The oxygen deficiency in the TCO alters the optical properties of the TCO causing the oxygen deficient TCO of the composite optical destructive layer 35 to absorb incident ambient light and reflected ambient light from the second electrode in OLED 30.

The composite optical destructive layer 35 in accordance with the present invention may be advantageously made of the same material as the substantially transparent first electrode 12 of the bottom emitting OLED 30. The composite optical destructive layer 35 may also be made from a combination of different materials. Furthermore, processes for forming the composite optical destructive layer 35 may be similar to that of forming of the substantially transparent first electrode 12. However, to modify the TCO which is the material forming the substantially transparent first electrode 12 to obtain the composite optical destructive layer 35, some modification of these processes are required.

The forming of the TCO layers (substantially transparent first electrode 12 and the relatively transparent composite optical destructive layer 35) may be performed by thin film deposition of which examples are RF and DC magnetron sputtering in the presence of hydrogen in a gas mixture or other reducing species or ions that enable to alter the optical properties of the depositing film. The RF or DC Magnetron sputtering of TCO is performed in an argon/hydrogen gas mixture so as to provide the presence of hydrogen ions. By varying the partial pressure of the hydrogen gas in the gas mixture, the level of oxygen deficiency in the TCO may also be varied. The composite optical destructive layer 35 is thus formed from a highly oxygen deficient variant of the TCO used to form the substantially transparent first electrode 12.

When using other methods for thin film deposition, such as DC magnetron sputtering, reactive thermal evaporation, e-beam and CVD; providing a oxygen deficient environment during the thin film deposition would also serve to form the oxygen deficient TCO thereby forming the composite optical destructive layer 35.

The composite optical destructive layer may be incorporated into the electrodes of the OLED resulting in a composite optical destructive electrode. The composite optical destructive electrode exhibits a gradient of varying degrees of refractive index caused by the varying oxygen deficiency in its material.

Figure 3A:
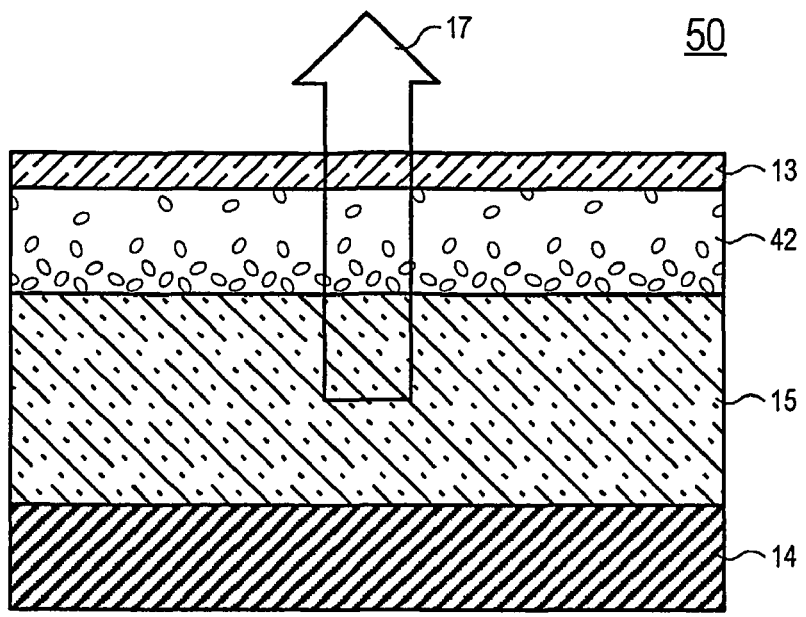
FIG. 3 illustrates a) bottom emitting OLED and b) top emitting OLED in accordance with another embodiment of the present invention.

Referring to FIG. 3 (a), the composite optical destructive first electrode 42 of a bottom emitting OLED 50 in accordance with the present invention comprises a gradient of varying degrees of oxygen deficiency in the material, which is used to form the electrode.

The composite optical destructive electrode 42 may further be made from a single material having varying oxygen deficiencies or a combination of different materials. The composite optical destructive electrode 42 may also be described to be a semi-transparent stack. Its relative transparency allows the passage of light emitted from the light emitting layer of the electroluminescent stack but absorbs the incident ambient and reflected ambient light from the OLED. This ultimately increases the contrast of the OLED.

When forming the composite optical destructive first electrode 42 using RF or DC Magnetron sputtering in an argon/hydrogen gas mixture, varying the partial pressure of the hydrogen gas results in varying the level of oxygen deficiency in the TCO deposited. The process of forming the composite optical destructive first electrode 42 may then be performed in a single continuous deposition of TCO, while varying the oxygen deficiency to obtain a gradient of varying degrees of oxygen deficiency in the electrode. This is advantageously a single process step as the material and process used to form the composite optical destructive first electrode is essentially the same.

Figure 2B:
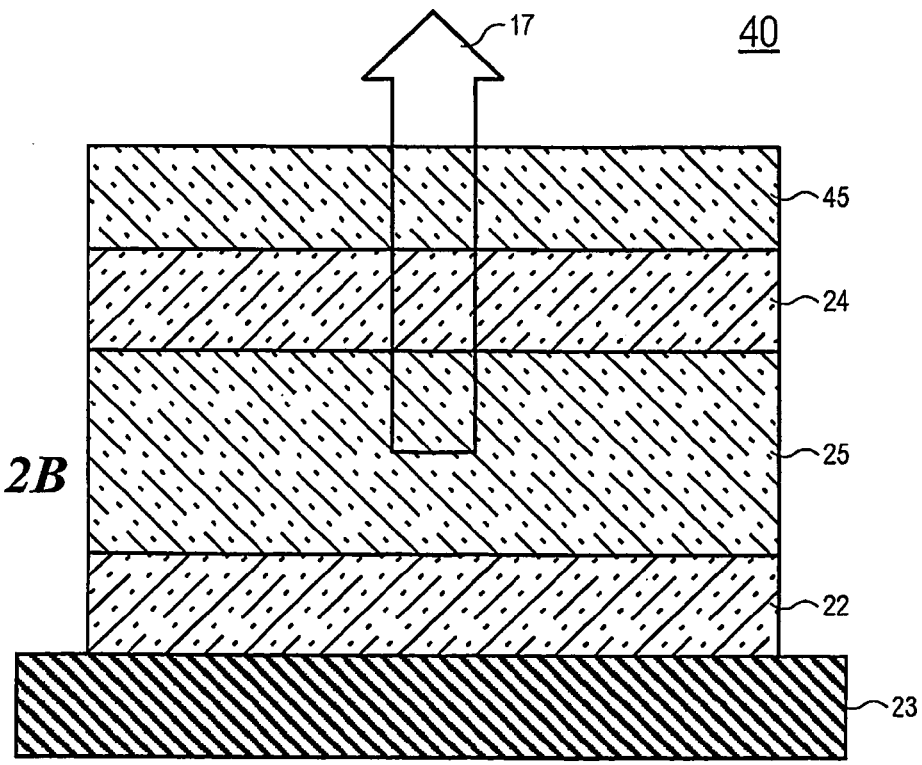

Referring to FIG. 2b, a top emitting OLED 40 in accordance with the present invention has a composite optical destructive layer 45 formed on the substantially transparent second electrode 24. The rest of the structure of the present top emitting OLED 40 is similar to that of the conventional top emitting OLED 20 in FIG. 1b.

The composite optical destructive layer 45 of the top emitting OLED 40 is also made from substantially the same material as the substantially transparent second electrode 24. They are essentially made from Transparent Conductive Oxides (TCOs). The composite optical destructive layer 45 being formed from a highly oxygen deficient variant of the TCO used to form the substantially transparent second electrode 24 of the top emitting OLED 40.

Methods of forming the composite optical destructive layer 45 of the top emitting OLED 40 are typically similar to the forming of the composite optical destructive layer 35 of the bottom emitting OLED 30.

Figure 3B:
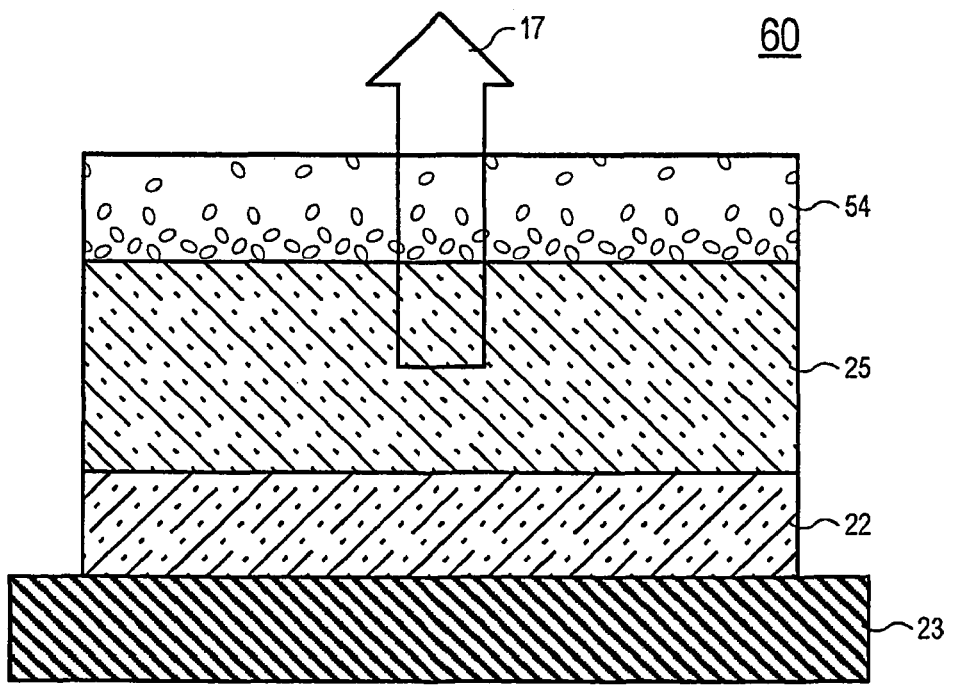

Similarly, the composite optical destructive layer 45 of the top emitting OLED 40 may further be incorporated into the substantially transparent second electrode 24 to form a single composite optical destructive second electrode 54 as in FIG. 3b.

The composite optical destructive second electrode 54 of the top emitting OLED 60 is very much similar to the composite optical first electrode 42 of the bottom emitting OLED 50. The composite optical destructive second electrode 54 also comprises a gradient of varying degrees of oxygen deficiency in the TCO that is used to form the electrode. The composite optical destructive second electrode 54 is then able to absorb incident ambient light as well as reflected ambient light from the OLED.

Figure 4:
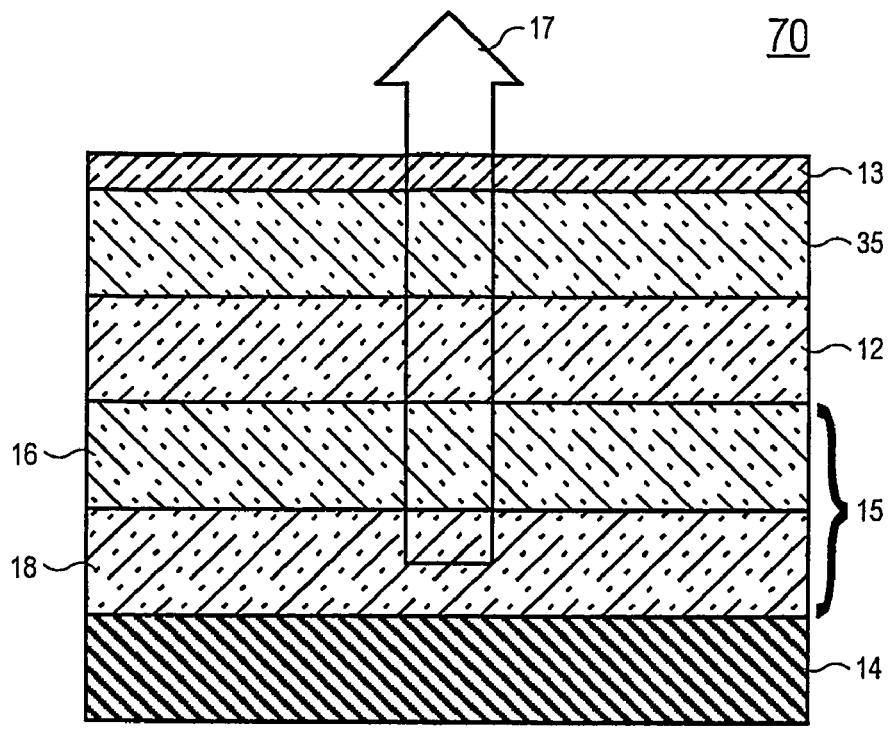
FIG. 4 illustrates an example of a bottom emitting OLED structure in accordance with the present invention.

An example of a bottom emitting OLED structure in accordance with the present invention is shown in FIG. 4. The bottom emitting OLED 70 comprises a transparent substrate 13 formed on the composite optical destructive layer 35 made of a highly oxygen deficient Indium tin oxide (ITO). The substantially transparent first electrode 12 follows and is made from transparent ITO of about 130 nm thickness. The next layer is a hole-transport layer 16 made from NPB and the light emitting layer 18 formed from $Alq_3$ of 75 nm thickness. Together these two layers, the hole-transport layer 16 and the light emitting layer 18 form the electroluminescent stack 15. The last layer is then the second electrode 14 which is made from 10 nm of Calcium and 200 nm of Silver.

Figure 5:
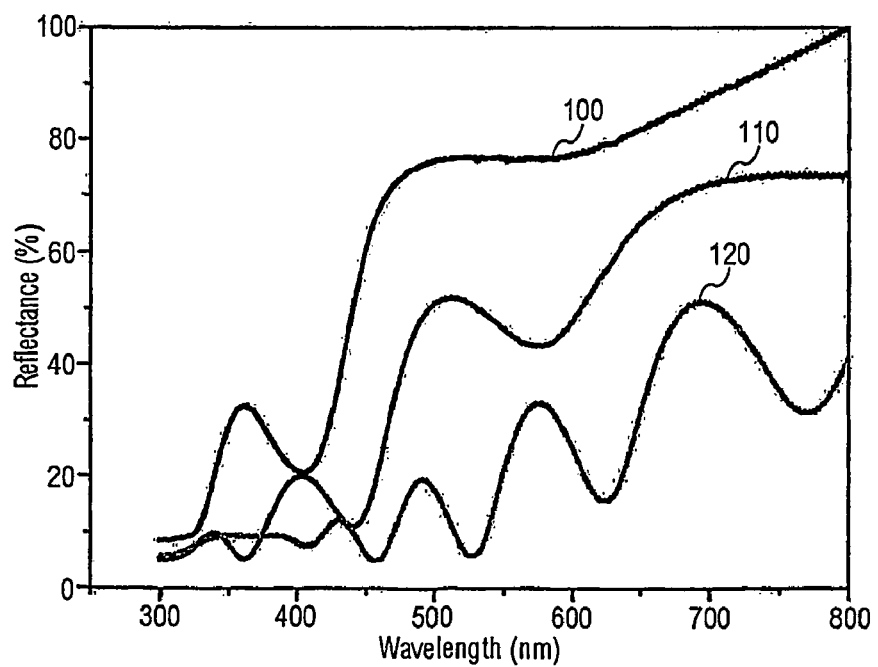
FIG. 5 illustrates a graph of reflectance of a bottom emitting OLED of FIG. 4.

Referring to FIG. 5, experimental results of reflectance measurements of bottom emitting OLEDs when exposed to a ambient light having a range of wavelengths of the above example with different thickness of composite optical destructive layer 35 is shown. Line 100 shows the high reflectance readings of the bottom emitting OLED 70 when the composite optical destructive layer 35 is not present (i.e. 0 nm).

Line 110 is the reflectance of the bottom emitting OLED 70 having the composite optical destructive layer 35 of thickness 110 nm, and line 120 having a thickness of 400 nm. The reflectance readings clearly indicate that with the incorporation of the highly oxygen deficient ITO as the composite optical destructive layer 35, the reflected ambient light from the bottom emitting OLED 70 is reduced as much as 60%.

While the above example uses ITO as the TCO in the electrodes and the composite optical destructive layers, other materials may further be considered. Some non-limiting examples of TCOs are aluminum-doped ZnO, $SnO_2$, Ga—In—Sn—O (GITO), Zn—In—Sn—O (ZITO), Ga—In—O and Zn—In—O. These materials can be used individually or in a combination of different materials.

The concept of composite optical electrode can also be used in other types of light-emitting devices. When a transparent rigid or flexible substrate is used for the electroluminescent devices, a high contrast FPD may also include a suitable anti-reflective layer on the opposite side of the substrate. It will be appreciated that various modifications and improvements can be made by a person skilled in the art without departing from the scope of the present invention.

The invention claimed is:

1. An electroluminescent device comprising:
a first composite optical destructive electrode capable of reducing reflection of ambient light;
a second electrode; and
an electroluminescent stack formed between said first composite optical destructive electrode and said second electrode;
said electroluminescent stack comprising at least one light emitting layer;
wherein said electroluminescent device is configured to produce illumination viewable through the first composite optical destructive electrode, and the first composite optical destructive electrode has a gradient of varying degrees of refractive index.

2. The electroluminescent device of claim 1, wherein said first composite optical destructive electrode has a varying oxygen deficiency in at least one material of said first composite optical destructive electrode.

3. The electroluminescent device of claim 2, wherein said material is a Transparent Conductive Oxide.

4. The electroluminescent device of claim 3, wherein said composite optical destructive layer is formed from one or more materials selected from the group consisting of aluminum-doped ZnO, $SnO_2$, Ga—In—Sn—O (GITO), Zn—In—Sn—O (ZITO), Ga—In—O, Zn—In—O and organic or inorganic materials that are suitable for the purpose.

5. The electroluminescent device of claim 1, wherein said first composite optical destructive electrode is formed by RF/DC magnetron sputtering in a gas mixture capable of forming said varying degrees of oxygen deficient material.

6. The electroluminescent device of claim 5, wherein said gas mixture comprises hydrogen gas.

7. The electroluminescent device of claim 6, wherein partial pressure of hydrogen gas in said gas mixture is varied to form said varying degrees of oxygen deficient material.

* * * * *